United States Patent
Taseda et al.

(10) Patent No.: US 10,622,149 B2
(45) Date of Patent: Apr. 14, 2020

(54) METHOD FOR PRODUCING AN ELECTRONIC COMPONENT

(71) Applicant: Murata Manufacturing Co., Ltd., Nagaokakyo-shi, Kyoto-fu (JP)

(72) Inventors: Yasunori Taseda, Nagaokakyo (JP); Isamu Fujimoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 523 days.

(21) Appl. No.: 15/084,841

(22) Filed: Mar. 30, 2016

(65) Prior Publication Data
US 2016/0211076 A1 Jul. 21, 2016

Related U.S. Application Data

(62) Division of application No. 13/888,639, filed on May 7, 2013, now Pat. No. 9,330,848.

(30) Foreign Application Priority Data

May 8, 2012 (JP) .................................. 2012-106818
Feb. 19, 2013 (JP) .................................. 2013-029913

(51) Int. Cl.
*H01G 4/232* (2006.01)
*H01G 4/30* (2006.01)
(Continued)

(52) U.S. Cl.
CPC .......... *H01G 4/2325* (2013.01); *H01G 4/248* (2013.01); *H01G 4/30* (2013.01); *H05K 1/185* (2013.01);
(Continued)

(58) Field of Classification Search
CPC ........ H01G 4/2325; H01G 4/30; H01G 4/232; H01G 4/248; H01G 4/228; H01G 4/005;
(Continued)

(56) References Cited

U.S. PATENT DOCUMENTS 5,865,920 A * 2/1999 Sakuratani .......... H01L 21/4846
156/246
6,124,769 A 9/2000 Igarashi et al.
(Continued)

FOREIGN PATENT DOCUMENTS

| JP | 2003-309373 A | 10/2003 |
|----|---------------|---------|
| JP | 3831497 B2 | 10/2006 |
| JP | 2012-54410 A | 3/2012 |

OTHER PUBLICATIONS

Official Communication issued in corresponding Korean Patent Application No. 10-2013-0051404, dated Sep. 23, 2016.
(Continued)

*Primary Examiner* — Minh N Trinh
(74) *Attorney, Agent, or Firm* — Keating & Bennett, LLP

(57) ABSTRACT

A method for producing an electronic component including a body and first and second external electrodes arranged on an external surface of the body. An edge portion of the first external electrode and an edge portion of the second external electrode face each other on the body. The first and second external electrodes each include a copper-metal-containing layer and a protective copper oxide layer covering the copper-metal-containing layer within the edge portion of the first and second external electrodes, respectively.

5 Claims, 13 Drawing Sheets

(51) Int. Cl.
    *H01G 4/248*  (2006.01)
    *H05K 1/18*  (2006.01)
(52) U.S. Cl.
    CPC ... *H05K 2201/10636* (2013.01); *Y02P 70/611* (2015.11); *Y10T 29/43* (2015.01)
(58) Field of Classification Search
    CPC .............. H01G 4/008; H01G 4/0085; H05K 2201/10636; H05K 1/185; H01L 23/53228
    See application file for complete search history.

(56) References Cited

U.S. PATENT DOCUMENTS

| | | | | |
|---|---|---|---|---|
| 6,729,003 B2 * | 5/2004 | Yokoyama | ............. | H01C 1/148 29/25.41 |
| 7,859,822 B2 * | 12/2010 | Nakano | ................... | H01G 4/06 361/303 |
| 8,819,932 B2 * | 9/2014 | Sato | ........................ | H01C 1/14 29/825 |
| 9,330,848 B2 * | 5/2016 | Taseda | ..................... | H01G 4/30 |

OTHER PUBLICATIONS

Taseda et al., "Electronic Component, Electronic-Component-Embedded Substrate, and Method for Producing Electronic Component", U.S. Appl. No. 13/888,639, filed May 7, 2013.

* cited by examiner

METHOD FOR PRODUCING AN ELECTRONIC COMPONENT

BACKGROUND OF THE INVENTION

1. Field of the Invention

The present invention relates to an electronic component, an electronic-component-embedded substrate, and a method for producing an electronic component.

2. Description of the Related Art

Ceramic electronic components such as ceramic capacitors have been used in mobile communication terminals and many other electronic devices. To meet the recent increasing demand for smaller electronic devices, embedding electronic components in wiring boards and thereby reducing the size of electronic devices has been proposed. The electrical connection between an electric component embedded in a wiring board and the wiring is usually mediated by via-hole electrodes, and the via holes used in making these via-hole electrodes are created by irradiating the wiring board with a laser beam pointed at the external electrodes of the embedded electronic component. This means that the external electrodes of such built-in electronic components must be highly resistant to laser irradiation. As a solution to this, Japanese Unexamined Patent Application Publication No. 2012-28456 discloses a ceramic electronic component for use in a wiring board, and the external electrodes of this ceramic electronic component have a Cu-plated surface.

More recently, however, ceramic electronic components with further improved weather resistance, in particular, reliability under hot and humid conditions, are in increasing demand.

SUMMARY OF THE INVENTION

Accordingly, preferred embodiments of the present invention provide an electronic component with improved reliability.

An electronic component according to a preferred embodiment of the present invention includes a body and first and second external electrodes arranged on an external surface of the body. An edge portion of the first external electrode and an edge portion of the second external electrode face each other on the body. The first and second external electrodes each include a layer containing copper metal and a protective copper oxide layer covering the copper-metal-containing layer within the edge portion of the first and second external electrodes, respectively.

In a specific preferred embodiment of the electronic component according to the present invention, each of the protective layers preferably covers an entire surface of the corresponding copper-metal-containing layer.

In another specific preferred embodiment of the electronic component according to the present invention, the protective layers preferably contain $Cu_2O$.

In yet another specific preferred embodiment of the electronic component of the present invention, the protective layers preferably contain CuO.

In a different specific preferred embodiment of an electronic component according to the present invention, a minimum distance between the first external electrode and the second external electrode preferably is about 0.6 mm or less, for example.

An electronic-component-embedded substrate according to a preferred embodiment of the present invention includes a resin substrate and an electronic component embedded in the resin substrate. The electronic component includes a body and first and second external electrodes arranged on an external surface of the body. An edge portion of the first external electrode and an edge portion of the second external electrode face each other on the body. The first and second external electrodes each include a layer containing copper metal and a protective copper oxide layer covering the copper-metal-containing layer within the edge portion of the first and second external electrodes, respectively.

In a specific preferred embodiment of the electronic-component-embedded according to the present invention, the resin substrate includes a via hole in a main surface thereof, and the via hole borders the copper-metal-containing layer of the first or second external electrode. The resin substrate also includes a via-hole electrode provided in the via hole and connected to the copper-metal-containing layer of the first or second external electrode.

In another specific preferred embodiment of the electronic-component-embedded according to the present invention, the via hole borders the copper-metal-containing layer of the first or second external electrode through the corresponding protective layer.

In a method for producing an electronic component according to a preferred embodiment of the present invention, a body is prepared and an external electrode is formed on the body. The external electrode is formed by forming a layer containing copper metal and oxidizing a surface of the copper-metal-containing layer to form a protective copper oxide layer.

In a specific preferred embodiment of the method for producing an electronic component according to the present invention, the surface of the copper-metal-containing layer is oxidized by heating the external electrode in an oxygen-containing atmosphere.

Various preferred embodiments of the present invention provide electronic components with improved reliability.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
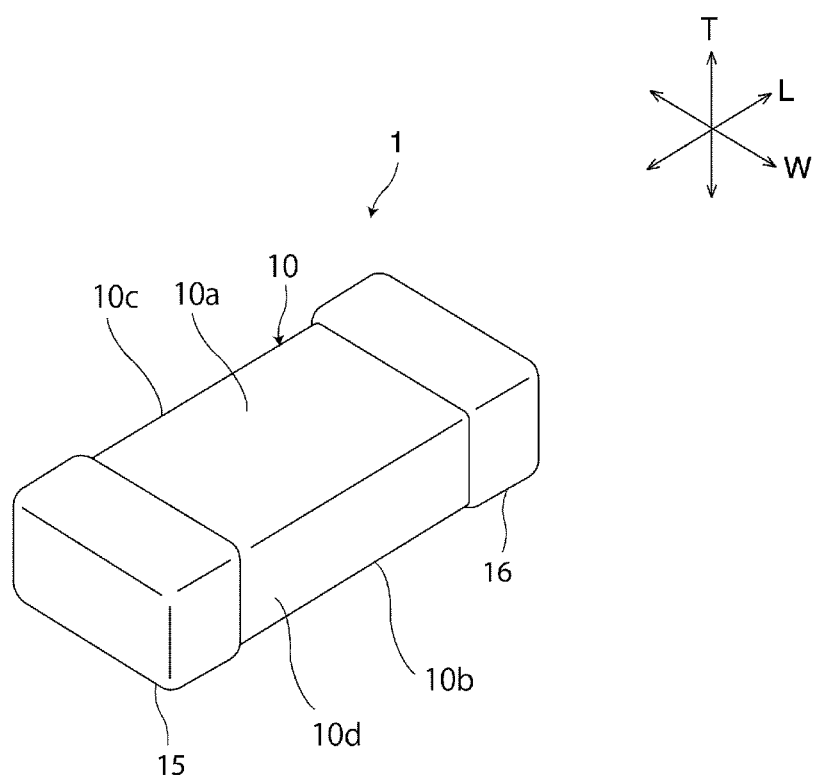
FIG. 1 is a schematic perspective view of a ceramic electronic component according to a preferred embodiment of the present invention.

The following describes preferred embodiments of the present invention. The following preferred embodiments are for illustration purposes only and do not limit the scope of the present invention.

In the drawings referenced hereinafter members having substantially the same function are denoted by the same reference numeral. Furthermore, these drawings include schematic diagrams; the relative dimensions and other attributes of the illustrated things may be different from the reality, and may differ even from drawing to drawing. The following description should be considered in determining the realistic relative dimensions and other attributes of these things.

Figure 2:
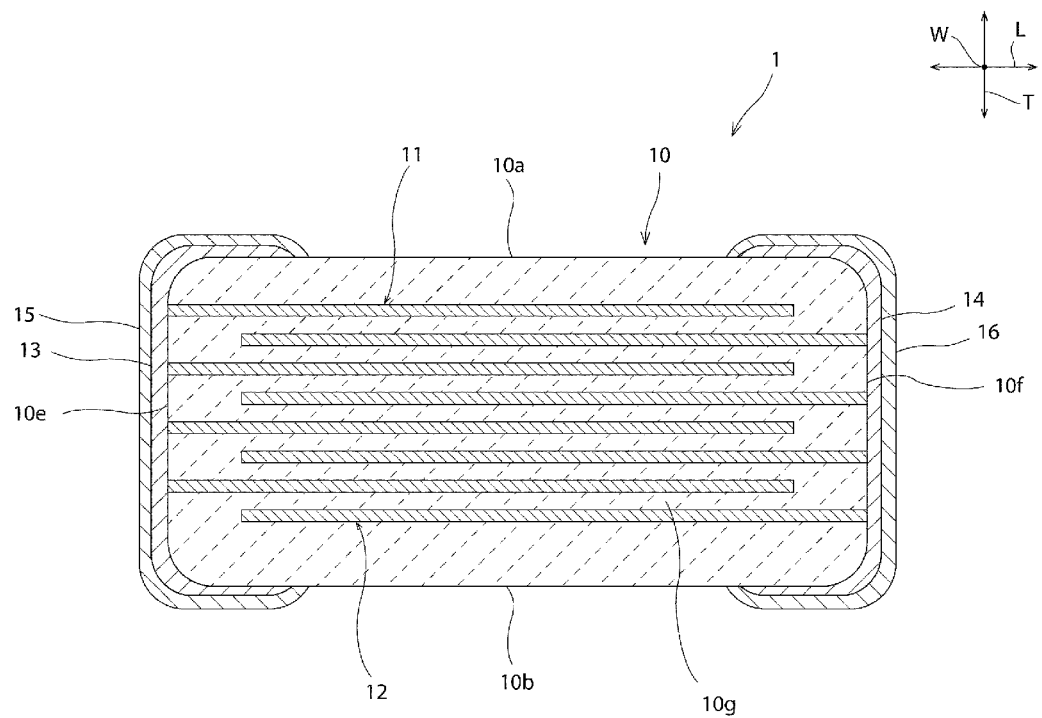
FIG. 2 is a schematic cross-sectional view of a ceramic electronic component according to a preferred embodiment of the present invention taken in a plane extending in the length and thickness directions.
Figure 3:
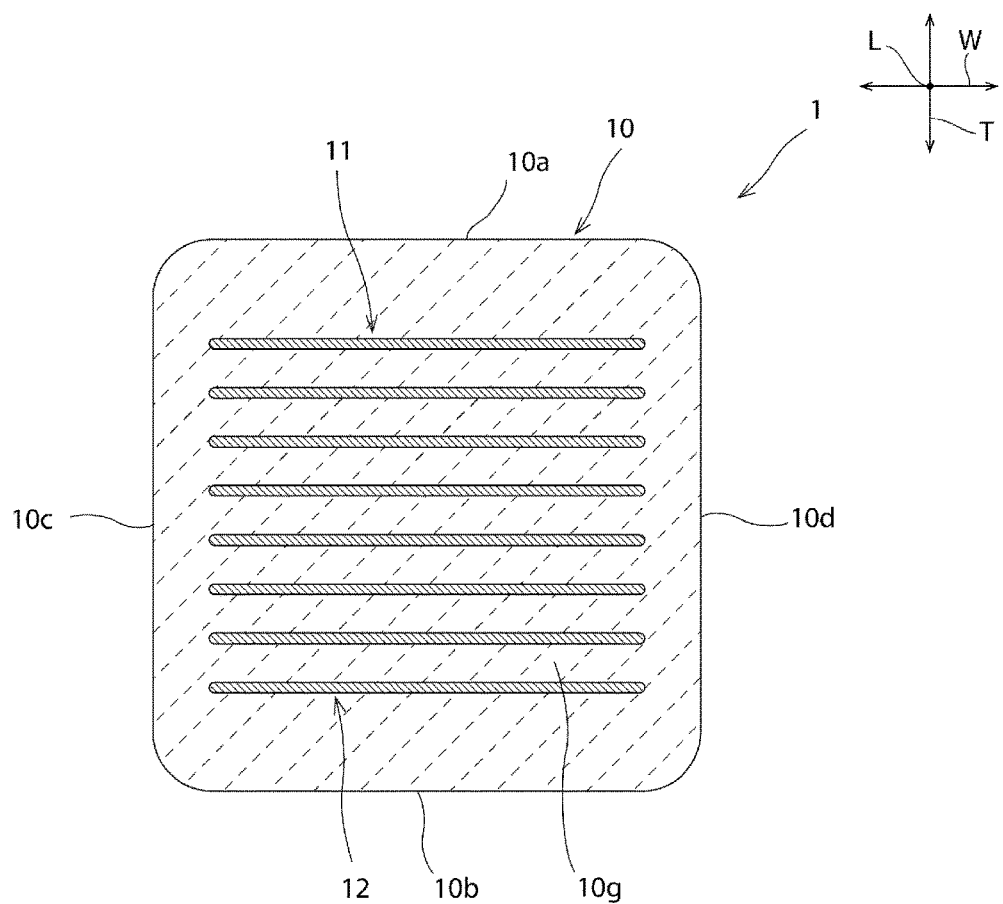
FIG. 3 is a schematic cross-sectional view of a ceramic electronic component according to a preferred embodiment of the present invention taken in a plane extending in the width and thickness directions.

FIG. 1 is a schematic perspective view of a ceramic electronic component according to a preferred embodiment of the present invention. FIG. 2 is a schematic cross-sectional view of a ceramic electronic component according to the same preferred embodiment taken in a plane extending in the length and thickness directions. FIG. 3 is a schematic cross-sectional view of a ceramic electronic component according to the same preferred embodiment taken in a plane extending in the width and thickness directions.

The ceramic electronic component 1 illustrated in FIGS. 1 to 3 can be, for example, a capacitor, an inductor, a resistor, a piezoelectric component, a thermistor, an IC, a composite component, etc. Note that electronic components covered by preferred embodiments of the present invention include not only ceramic ones but also those made of other materials such as, for example, resins, metals, and semiconductors.

The ceramic electronic component 1 can have any dimensions. For example, the length, width, and thickness of the ceramic electronic component 1 are preferably on the order of about 0.6 mm to about 1.6 mm, on the order of about 0.3 mm to about 0.8 mm, and on the order of about 0.05 mm to about 0.8 mm, respectively. A possible set of dimensions is a length of about 1.0 mm, a width of about 0.5 mm, and a thickness on the order of about 0.1 mm to about 0.55 mm, for example. Another possible set of dimensions is a length of about 0.6 mm, a width of about 0.3 mm, and a thickness on the order of about 0.1 mm to about 0.33 mm, for example.

The ceramic electronic component 1 preferably includes a body 10 (e.g., a ceramic body). The body 10 preferably has a rectangular or substantially rectangular parallelepiped shape, and the body 10 includes first and second main surfaces 10a and 10b extending in or substantially in the length and width directions L and W, first and second side surfaces 10c and 10d extending in or substantially in the length and thickness directions L and T (see FIG. 3), and first and second end surfaces 10e and 10f extending in or substantially in the width and thickness directions W and T (see FIG. 2).

The phrase "rectangular or substantially rectangular parallelepiped shape" includes cuboids having rounded edges and/or corners, for example.

The ceramic material used to define the body 10 can be of any suitable kind. An example of a material that can be used to define the body 10 preferably is a dielectric ceramic material mainly composed of barium titanate, calcium titanate, strontium titanate, calcium zirconate, or a similar compound. Besides a suitable ceramic material, the body 10 may further contain a secondary ingredient such as, for example, a Mn compound, a Co compound, a rare-earth compound, or a Si compound where necessary.

As illustrated in FIGS. 2 and 3, the body 10 preferably includes a first inner electrode 11 and a second inner electrode 12. Each of the first and second inner electrodes 11 and 12 are arranged to extend in or substantially in the length and width directions L and W. In other words, each of the first and second inner electrodes 11 and 12 is parallel or substantially in parallel with the first and second main surfaces 10a and 10b. In the thickness direction T, the first and second inner electrodes 11 and 12 face each other with ceramic layers 10g interposed therebetween.

The first inner electrode 11 reaches the first end surface 10e. The first inner electrode 11 extends from the first end surface 10e in the length direction L. The first inner electrode 11 does not reach the second end surface 10f or the first and second side surfaces 10c and 10d.

The second inner electrode 12 reaches the second end surface 10f. The second inner electrode 12 extends from the second end surface 10f in the length direction L. The second inner electrode 12 does not reach the first end surface 10e or the first and second side surfaces 10c and 10d.

Each of the first and second electrodes 11 and 12 can be made of any suitable conducive material. Specific examples of materials that can be used for each of the first and second electrodes 11 and 12 include, for example, Ni, Cu, Ag, Pd, Au, Pt, Sn, and similar elements as well as combinations of such elements.

The first inner electrode 11 is preferably connected to the first external electrode 13, as illustrated in FIG. 2. The first external electrode 13 covers at least a portion of the first end surface 10e and reaches the first and second main surfaces 10a and 10b. In other words, the first external electrode 13 preferably includes three sections: a section that covers substantially the entire area of the first end surface 10e, a section that reaches the first main surface 10a, and a section that reaches the second main surface 10b. The first external electrode 13 may also reach the first and second side surfaces 10c and 10d.

The second inner electrode 12 is preferably connected to the second external electrode 14. The second external electrode 14 covers at least a portion of the second end surface 10f and reaches the first and second main surfaces 10a and 10b. In other words, the second external electrode 14 preferably includes three sections: a section that covers substantially the entire area of the second end surface 10f, a section that reaches the first main surface 10a, and a section that reaches the second main surface 10b. The second external electrode 14 may also reach the first and second side surfaces 10c and 10d.

Each of the first and second external electrodes 13 and 14 preferably includes an edge portion, and their edge portions face each other on the same surfaces of the body 10. More specifically, the edge portions of the first and second external electrodes 13 and 14 are opposite each other on the first and second main surfaces 10a and 10b. The "edge portions" correspond to the sections of the first and second external electrodes 13 and 14 that include their extremities on the surface of the body 10.

Substantially the entire surface of each of the first and second external electrodes 13 and 14 is preferably covered with a layer containing Cu (copper metal). Each of the first and second external electrodes 13 and 14 may preferably be completely made of Cu or a Cu alloy or may include two layers one of which is a layer of Cu or a Cu alloy and the other a Cu-free layer located closer to the body 10. Examples of Cu alloys that can be used include, for example, Cu—Ag, Cu—Au, Cu—Al, Cu—Ni, and Cu—Pd. In this preferred embodiment, the entire surface of each of the first and second external electrodes 13 and 14 is preferably covered with a layer containing Cu.

A first protective layer 15 is on the surface of the copper-metal-containing layer of the first external electrode 13. The edge portion of the copper-metal-containing layer of the first external electrode 13 is preferably covered with the first protective layer 15 at least within the area where it faces the second external electrode 14. More specifically, the entire or substantially the entire surface of the copper-metal-containing layer of the first external electrode 13 preferably is covered with the first protective layer 15 in this preferred embodiment.

A second protective layer 16 is preferably provided on the surface of the copper-metal-containing layer of the second external electrode 14. The edge portion of the copper-metal-containing layer of the second external electrode 14 is preferably covered with the second protective layer 16 at least within the area where it faces the first external electrode 13 on the same surfaces of the body 10, i.e., at least on the main surfaces 10a and 10b. More specifically, the entire or substantially the entire surface of the copper-metal-containing layer of the second external electrode 14 is covered with the second protective layer 16 in this preferred embodiment.

The first and second protective layers 15 and 16 preferably contain copper oxide. More specifically, the first and second protective layers 15 and 16 preferably contain, for example, CuO and/or $Cu_2O$.

The presence of Cu, $Cu_2O$, and CuO can be identified by X-ray photoelectron spectroscopy (XPS). A Cu-LMM spectrum of a sample is measured using an XPS system, and the energy levels of the detected peaks are used to identify the presence of Cu, $Cu_2O$, and CuO. The peak corresponding to Cu appears around an energy level of 568.5 eV, that corresponding to $Cu_2O$ around 570 eV, and that corresponding to CuO around 569 eV, for example. If a peak is observed near 568.5 eV then the sample contains Cu, and if no peak is observed near this energy level then the sample contains no Cu. If a peak is observed near 570 eV then the sample contains $Cu_2O$, and if no peak is observed near this energy level then the sample contains no $Cu_2O$. If a peak is observed near 569 eV then the sample contains CuO, and if no peak is observed near this energy level then the sample contains no CuO. A protective layer therefore contains copper oxide if a Cu-LMM spectrum measured on the surface of the protective layer, which can possibly have three peaks corresponding to Cu, $Cu_2O$, and CuO, lacks the Cu peak and has the $Cu_2O$ or CuO peak.

The following is a non-limiting example of a process for producing the ceramic electronic component 1 in accordance with a preferred embodiment of the present invention. This process starts with forming first and second starting external electrodes each covered with a layer containing Cu (copper metal) on a body 10 including first and second electrodes 11 and 12. The first and second starting external electrodes can be formed by baking electrode paste applied in a layer or by a plating process, for example. When a plating process is used, the process may be an electrolytic or electroless one. In this preferred embodiment, the body 10 is preferably directly plated with Cu by electrolytic plating.

The starting external electrodes are then oxidized to form external electrodes 13 and 14 so that the edge portions of the copper-metal-containing layers of the resulting electrodes can be oxidized at least within the areas where they face each other on the same surfaces of the body 10 and that the copper-metal-containing layers of the resulting electrodes can also respectively be covered with protective copper oxide layers 15 and 16 (oxidation). In this way, the ceramic electronic component 1 is completed. The starting external electrodes can be oxidized by various methods, including, for example, heating in an oxygen-containing atmosphere or immersion in a solution containing an oxidizing agent. When the starting external electrodes are formed by a plating process, it is also possible to adjust the composition of the plating bath so that the resulting plate layers can be easily oxidizable.

Figure 4:
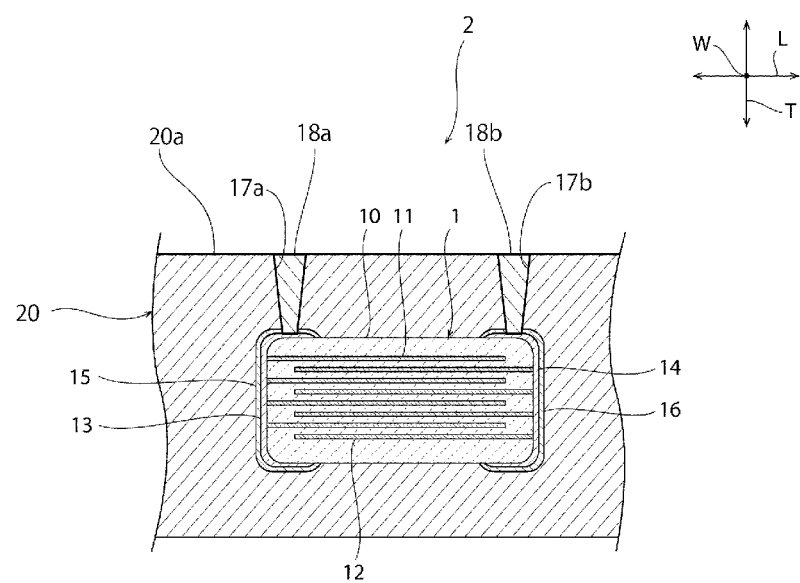
FIG. 4 is a schematic cross-sectional view of a portion of an electronic-component-embedded substrate according to a preferred embodiment of the present invention taken in a plane extending in the length and thickness directions.

FIG. 4 is a schematic cross-sectional view of a portion of an electronic-component-embedded substrate 2 containing a ceramic electronic component 1 taken in a plane extending in the length and thickness directions.

The electronic-component-embedded substrate 2 is an example of a possible use of the ceramic electronic component 1. The electronic-component-embedded substrate 2 preferably includes a resin substrate 20. The resin substrate 20 is preferably made of a resin or a resin composition. Among others, a glass epoxy substrate or a polyvinyl alcohol substrate, for example, can be used to form the resin substrate 20. The resin substrate 20 may include wiring on its surface, in its interior, or any other portion of it. When the resin substrate 20 has wiring, the resin substrate 20 may also be referred to as a "wiring board".

The resin substrate 20 contains a ceramic electronic component 1. The resin substrate 20 preferably includes via holes 17a and 17b in a main surface 20a of the resin substrate 20. The via hole 17a borders the copper-metal-containing layer of the first external electrode 13 of the ceramic electronic component 1 through the protective layer 15. A via-hole electrode 18a is preferably provided in the via hole 17a, and the via-hole electrode 18a is preferably connected to the first external electrode 13. On the other hand, the via hole 17b borders the copper-metal-containing layer of the second external electrode 14 of the ceramic electronic component 1 through the protective layer 16. A via-hole electrode 18b is in the via hole 17b, and the via-hole electrode 18b is connected to the second external electrode 14.

The following is a non-limiting example of a process for producing the electronic-component-embedded substrate 2 in accordance with a preferred embodiment of the present invention. First, a ceramic electronic component 1 is embedded in a resin substrate 20. The main surface 20a side of the resin substrate 20 is then irradiated with a laser beam pointed at the first and second electrodes 13 and 14, forming via holes 17a and 17b. Via-hole electrodes 18a and 18b are then formed in the via holes 17a and 17b. In this way, the electronic-component-embedded substrate 2 is completed.

The copper-metal-containing layers of the external electrodes 13 and 14 effectively reflect laser light. This means that the body 10 can remain relatively intact even when a laser beam is used to form the via holes 17a and 17b.

On the other hand, the protective layers 15 and 16, which contain copper oxide, of the external electrodes 13 and 14 are burnt out upon exposure to a laser beam. The via holes 17a and 17b therefore penetrate through the protective layers 15 and 16, respectively, and reach the copper-metal-containing layers of the external electrodes 13 and 14. Although the copper-metal-containing layers of the external electrodes 13 and 14 reflect some laser light, these layers are also lost, to a small extent, upon exposure to a laser beam. It is therefore preferred that the protective layers 15 and 16 are thinner than the copper-metal-containing layers of the external electrodes 13 and 14; this prevents performance degradation due to damage to the copper-metal-containing layers of the external electrodes 13 and 14. More specifically, it is preferred that the copper-metal-containing layers of the external electrodes 13 and 14 have a thickness of about 3 µm or more while the protective layers 15 and 16 have a thickness of about 0.1 µm or less, for example.

In a ceramic electronic component including external electrodes with layers containing copper metal, applying voltage in the presence of moisture causes the Cu (copper metal) atoms in the external electrodes 13 and 14 to be ionized when the copper-metal-containing layers of the external electrodes 13 and 14 are exposed. The ionized Cu atoms (copper ions) migrate and undergo chemical reduction, and solid Cu separates out. This phenomenon is referred to as "ion migration". Ion migration can cause, in some cases, the first and second external electrodes 13 and 14 to form a short circuit. In particular, when the first and second external electrodes face each other on main surfaces and/or side surfaces of the electronic component, a short circuit is likely to occur in their edge portions extending on these surfaces in association with electrochemical migration of Cu.

Thus, the external electrodes 13 and 14 of the ceramic electronic component 1 embedded in the resin substrate 20 preferably have a large enough area on the first main surface 10a to ensure that the laser beam hits the external electrodes 13 and 14. Given the positional precision of laser irradiation, it is preferred that the areas the external electrodes 13 and 14 have on the first main surface can contain a circle with a radius of about 0.1 mm or more, for example. This arrangement, however, makes the distance between the external electrodes 13 and 14 shorter which thus makes it more likely that a decrease in insulation resistance associated with ion migration will occur. The risk of short circuits due to ion migration is further increased when the distance between the external electrodes 13 and 14 is about 0.6 mm or less, for example.

For this reason, the ceramic electronic component 1 included in this preferred embodiment includes protective copper oxide layers 15 and 16 covering the surface of the external electrodes 13 and 14. The ceramic electronic component 1 is thus free of electrochemical migration of Cu (i.e., the formation of solid Cu that can occur under hot and humid conditions) even when it is supplied with a voltage in the presence of moisture. Effectively preventing a decrease in insulation resistance associated with electrochemical migration of Cu in this way improves reliability. The use of these protective copper oxide layers 15 and 16 is particularly effective when the distance between the external electrodes 13 and 14 is about 0.6 mm or less, for example, and the ceramic electronic component 1 is likely to experience failures due to ion migration. Too short of a distance between the protective layers 15 and 16, however, may cause the field strength to be too low. For this reason, it is preferred that the distance between the protective layers 15 and 16 is about 50 µm or more, for example.

The protective layers 15 and 16 are preferably formed by oxidizing Cu plates as this ensures that thin and uniform layers are produced. More preferably, the protective layers 15 and 16 are formed by heating the first and second external electrodes 13 and 14 in an oxygen-containing atmosphere. This results in the entire or substantially the entire surface of the copper-metal-containing layers being covered with the protective layers 15 and 16.

However, it is also possible to form the protective layers 15 and 16 by sputtering or any other suitable thin-film formation technique.

Accordingly, ion migration can preferably be prevented regardless of whether or not the resulting protective layers 15 and 16 contain CuO or the resulting protective layers 15 and 16 contain $Cu_2O$. However, the presence of CuO in the protective layers 15 and 16 is more effective in preventing ion migration. For effective prevention of ion migration, therefore, it is preferred that the protective layers 15 and 16 contain CuO. More preferably, the protective layers 15 and 16 are composed solely of CuO.

For the sake of formability, however, it is preferred that the protective layers 15 and 16 contain $Cu_2O$.

It is also possible that the protective layers 15 and 16 contain both CuO and $Cu_2O$. This makes it easier to form the protective layers 15 and 16 and also preferably ensures that ion migration is effectively prevented. A Cu-LMM spectrum measured in a sample containing both CuO and $Cu_2O$ may show a broad peak generated by overlapping of the two because the energy level of the peak corresponding to $Cu_2O$ (around 570 eV) is very close to that of the peak corresponding to CuO (around 569 eV).

In addition, the protective layers 15 and 16, which contain copper oxide, are more adhesive to the resin substrate 20 than the copper-metal-containing layers are. The protective layers 15 and 16 therefore effectively fill the gap between the resin substrate 20 and the ceramic electronic component 1, making the joint between the resin substrate 20 and the ceramic electronic component 1 waterproof. This also prevents ion migration and further improves reliability. For better adhesion, it is preferred that the protective layers 15 and 16 cover the entire surface of the copper-metal-containing layers and that these layers are composed solely of CuO. It is therefore more preferred that the copper-metal-containing layers are completely covered with protective layers made of CuO.

Figure 5:
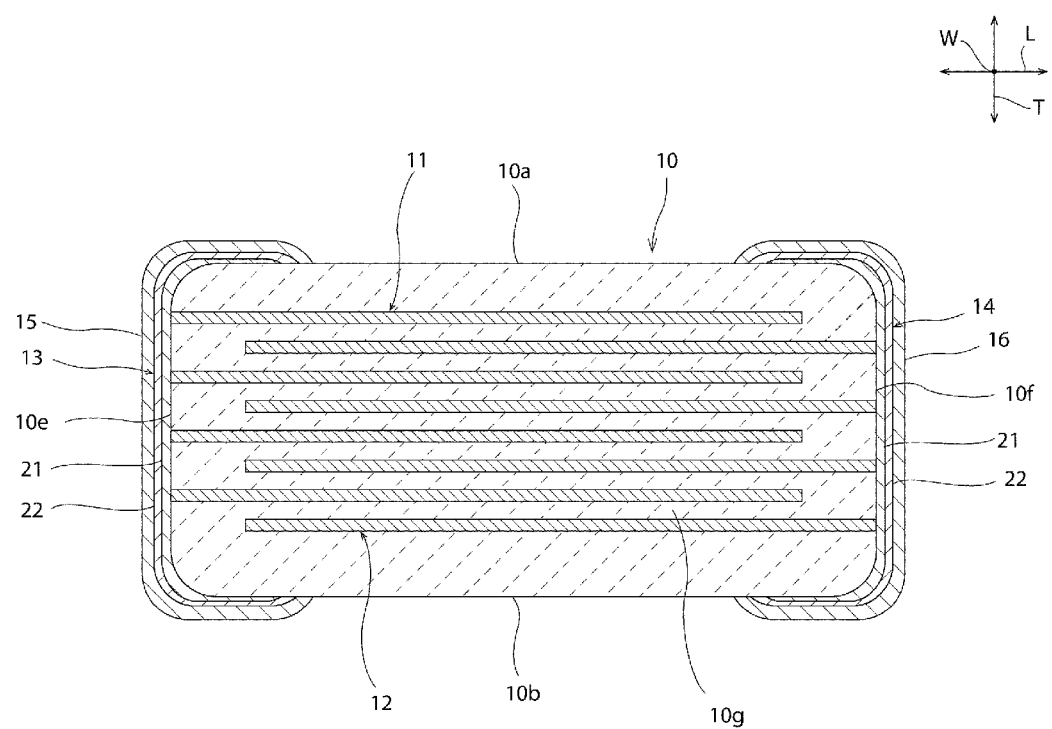
FIG. 5 is a schematic cross-sectional view of a ceramic electronic component according to a first modification of a preferred embodiment of the present invention taken in a plane extending in the length and thickness directions.

FIG. 5 is a schematic cross-sectional view of a ceramic electronic component according to a first modification of a preferred embodiment of the present invention taken in a plane extending in the length and thickness directions.

In the above preferred embodiments, the copper-metal-containing layers are preferably directly on the body 10. However, this is not the only possible constitution in preferred embodiments of the present invention. FIG. 5 illustrates an example, in which the external electrodes 13 and 14 are laminates each defined by at least one base electrode layer 21 and at least one plate layer 22 that contains copper metal. The base electrode layer 21 may contain a metal that defines a solid through a plating process, such as, for example, Ni or Cu. The base electrode layer 21 can be, among others, a film formed, for example, by baking metal particles. When the base electrode layer 21 is of this type, it can preferably be formed, for example, by applying an electrode paste that contains a metal powder and an inorganic coupling agent such as, for example, a ceramic material or a glass component and then baking the resulting coating. The metal powder used in this process can preferably be a powder of, for example, among others, Ni, Cu, Ag, Pd, or Au or a mixture of such powders or be made from an alloy such as Ag—Pd. The electrode paste can preferably be applied by, for example, a printing or immersion process or any other appropriate technique.

Figure 6:
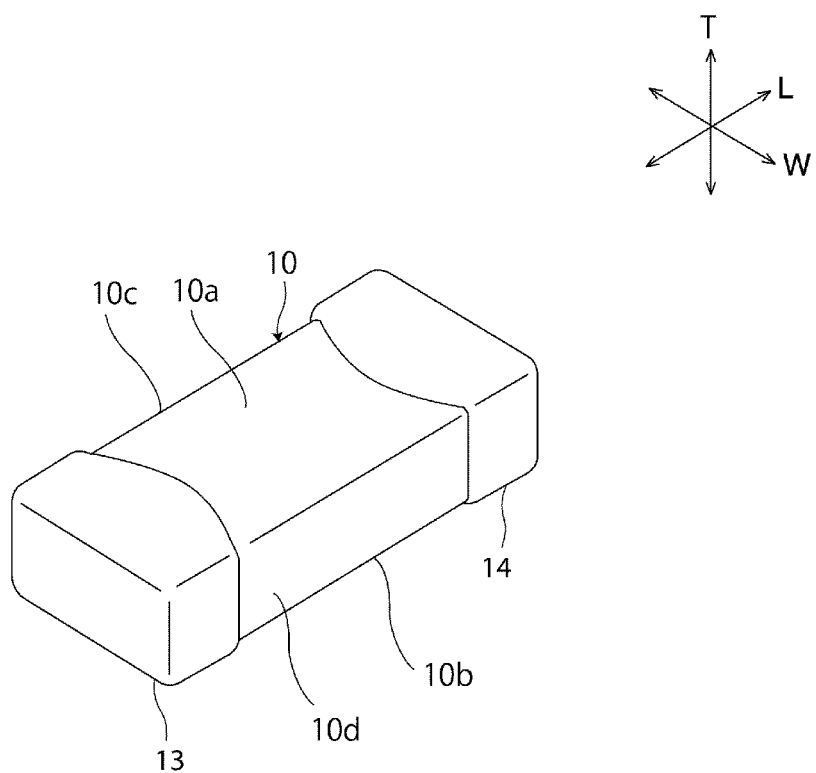
FIG. 6 is a schematic perspective view of a ceramic electronic component according to a second modification of a preferred embodiment of the present invention.

When the electrode paste is applied by an immersion process, the resulting external electrodes 13 and 14 include curved portions extending on the main surfaces 10a and 10b with the apex thereof in or substantially in the middle of the surface in the width direction W as illustrated in a second modification of a preferred embodiment of the present invention as depicted in FIG. 6. This arrangement makes the distance between the first and second external electrodes 13 and 14 shorter and thus makes it more likely that a strong electric field will be produced. As a result, it becomes more likely that a short circuit will occur in association with ion migration. The above technique, by which short circuits due to ion migration can preferably be prevented, is therefore also particularly effective in ceramic electronic components of this type.

Figure 7:
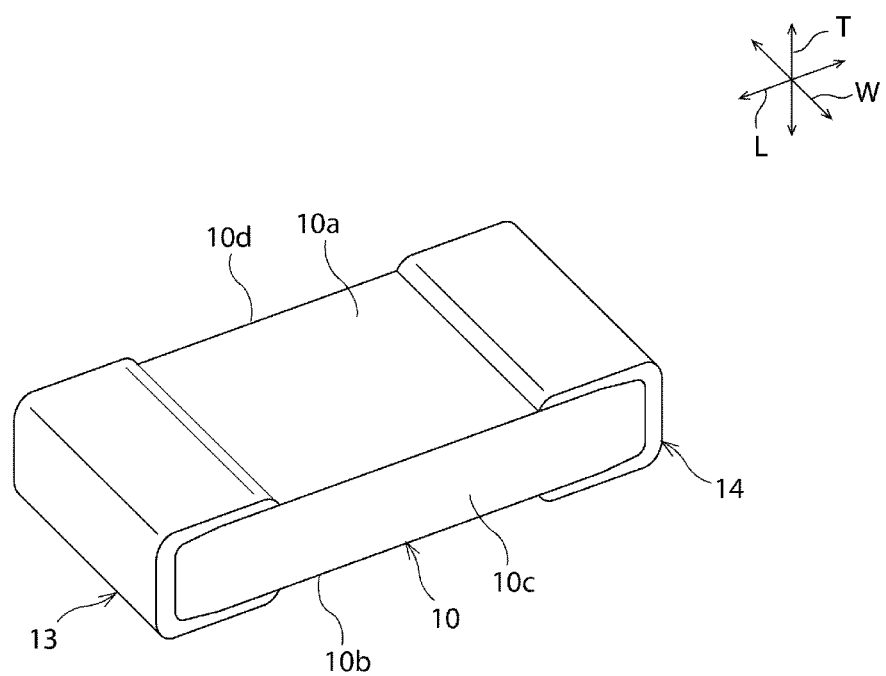
FIG. 7 is a schematic perspective view of a ceramic electronic component according to a third modification of a preferred embodiment the present invention.

FIG. 7 is a schematic perspective view of a ceramic electronic component according to a third modification of a preferred embodiment of the present invention. As illustrated in FIG. 7, it is allowed that the first and second external electrodes 13 and 14 extend on the first and second end surfaces 10e and 10f and on the first and second main surfaces 10a and 10b while the entire or substantially the entire surface of the first and second lateral surfaces 10c and 10d is exposed. A non-limiting example of a process for forming the external electrodes 13 and 14 in this shape in accordance with a preferred embodiment of the present invention is as follows: Electrode paste is applied to the main surfaces of an unbaked ceramic body by a printing process, the end surfaces of the ceramic body are immersed in the electrode paste, the ceramic body is then baked together with the coatings formed thereon, and a plating process follows.

Figure 8:
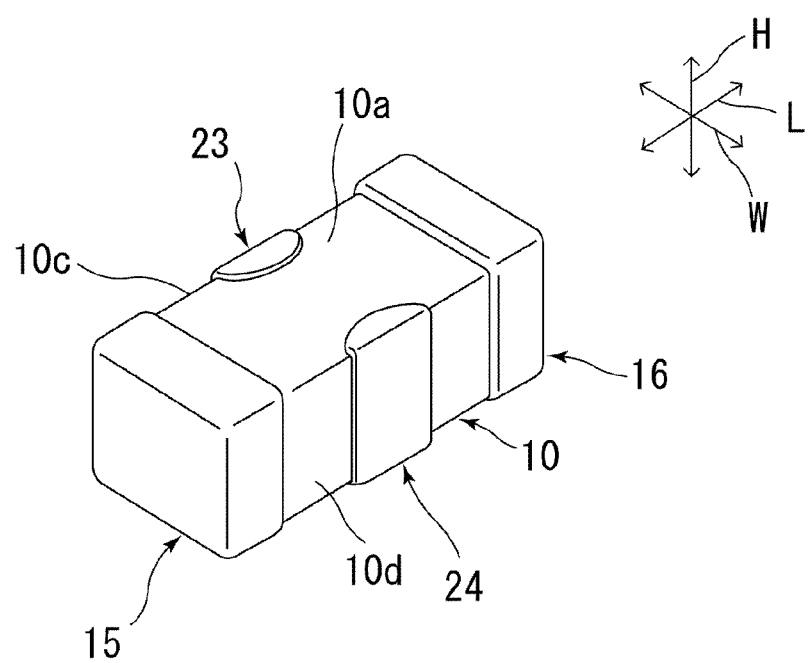
FIG. 8 is a schematic perspective view of a ceramic electronic component according to a fourth modification of a preferred embodiment of the present invention.

FIG. 8 is a schematic perspective view of a ceramic electronic component according to a fourth modification of a preferred embodiment of the present invention.

FIG. 8 illustrates another possible arrangement of a preferred embodiment of the present invention, in which additional external electrodes 23 and 24, each covered with a protective layer, are preferably provided in addition to the first and second external electrodes 13 and 14; thus, there can be three or more external electrodes in preferred embodiments of the present invention. In general, the electrode spacing of external electrodes is preferably smaller in a ceramic electronic component having three or more external electrodes than in a component having two. When a ceramic electronic component with external dimensions of 1.0 mm×0.5 mm has three external electrodes each measuring more than 0.2 mm wide on the main surfaces, the spacing of the external electrodes is preferably less than about 0.2 mm, for example. Such a ceramic electronic component is likely to experience a resistance drop caused by ion migration when used embedded in a resin substrate. Accordingly, ceramic electronic components including three or more external electrodes are thus unsuitable for use in resin substrates. This modification, in which protective layers are provided to a ceramic electronic component of that type, prevents ion migration and allows the electronic component to be used where it is embedded in a resin substrate.

In Experiment 1, a ceramic electronic component was prepared to have substantially the same construction as the one according to the third modification of the preferred embodiment illustrated in FIG. 7 except that no protective layers were arranged on the surface of the external electrodes 13 and 14.

The process was as follows. An electrode paste containing Ni was applied to the main surfaces of an unbaked ceramic body by a printing process, the end surfaces of the ceramic body were the Ni-containing electrode paste, and the ceramic body was then baked together with the resulting coatings of the electrode paste. The resulting base electrode layers, i.e., the baked coatings of the electrode paste, were each plated with Cu and thus covered with a layer containing copper metal to complete the ceramic electrode component. The obtained ceramic electronic component measured approximately 1.0 mm, 0.5 mm, and 0.2 mm in length, width, and thickness, respectively, and the distance between its first and second external electrodes was about 0.44 mm, for example.

In Experiment 2, a ceramic electronic component prepared in the same way as in Experiment 1 was left in the air at 70° C. for 5 minutes. The external electrodes 13 and 14 of the resulting ceramic electronic component 1 thus each had a protective layer composed solely of $Cu_2O$ on the copper-metal-containing layer thereof.

In Experiment 3, a ceramic electronic component prepared in the same way as in Experiment 1 was left in the air at 120° C. for 120 minutes. The external electrodes 13 and 14 of the resulting ceramic electronic component 1 thus each had a protective layer made solely of CuO on the copper-metal-containing layer thereof. The ceramic electronic components prepared in Experiments 1, 2, and 3 were analyzed by XPS on Quantum 2000 (PHYSICAL ELECTRONICS), and the obtained Cu-LMM spectra were used to confirm the presence of protective layers and characterize them.

Figure 11:
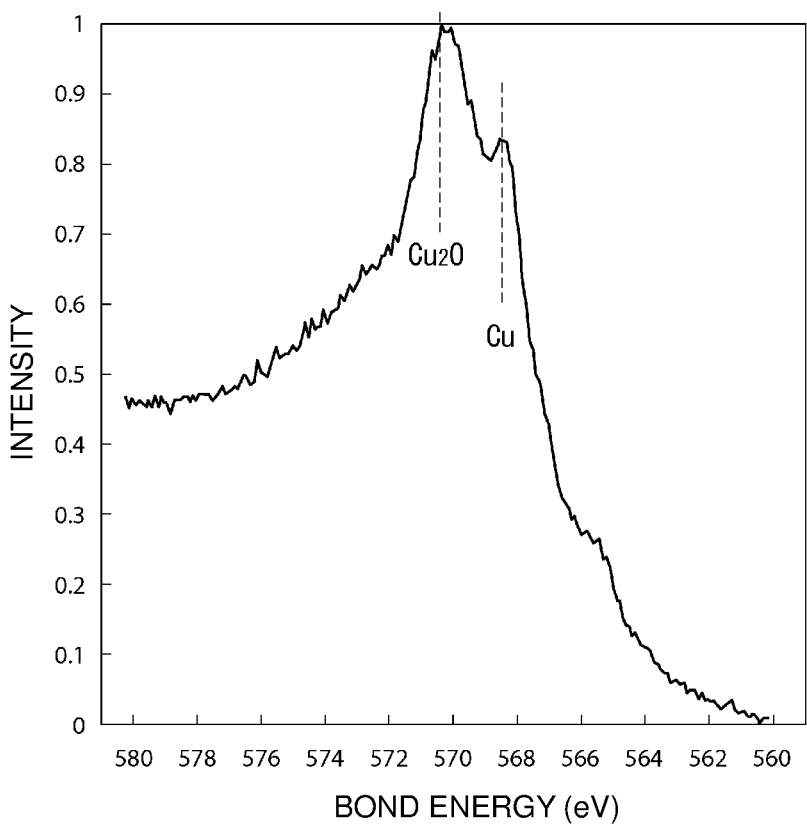
FIG. 11 is a Cu-LMM spectrum obtained in Experiment 1.

FIG. 11 is a Cu-LMM spectrum obtained in Experiment 1. As can be seen from FIG. 11, the Cu-LMM spectrum from Experiment 1 showed a peak corresponding to Cu, indicating that Cu was present on the surface of the protective layers.

Figure 12:
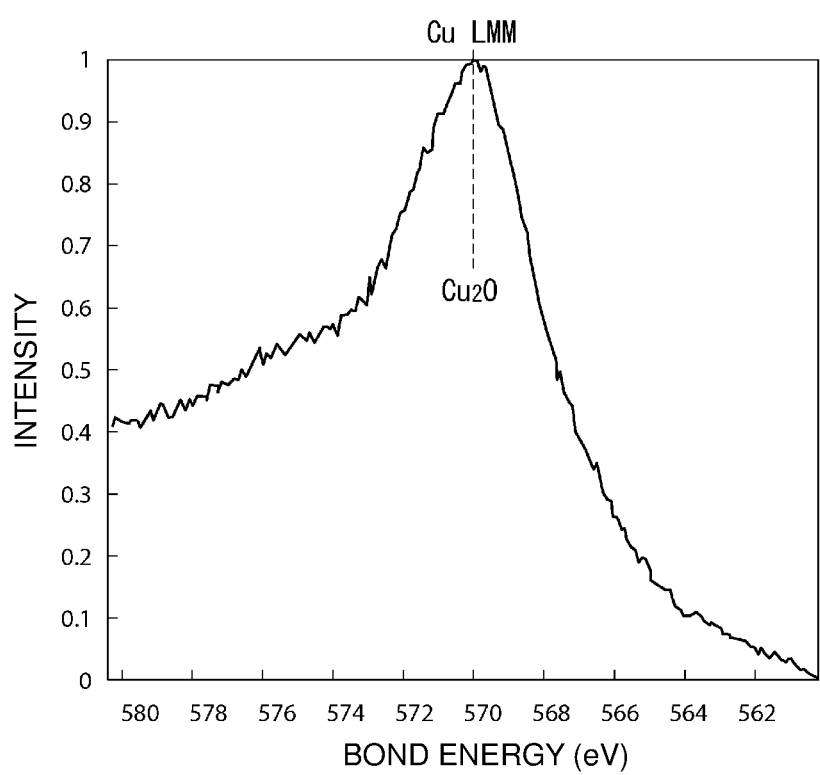
FIG. 12 is a Cu-LMM spectrum obtained in Experiment 2.

FIG. 12 is a Cu-LMM spectrum obtained in Experiment 2. As can be seen from FIG. 12, the Cu-LMM spectrum from Experiment 2 did not include a peak corresponding to Cu and showed a peak corresponding to $Cu_2O$, indicating that Cu was not present on the surface of the protective layers while $Cu_2O$ was present on the surface of the protective layers.

Figure 13:
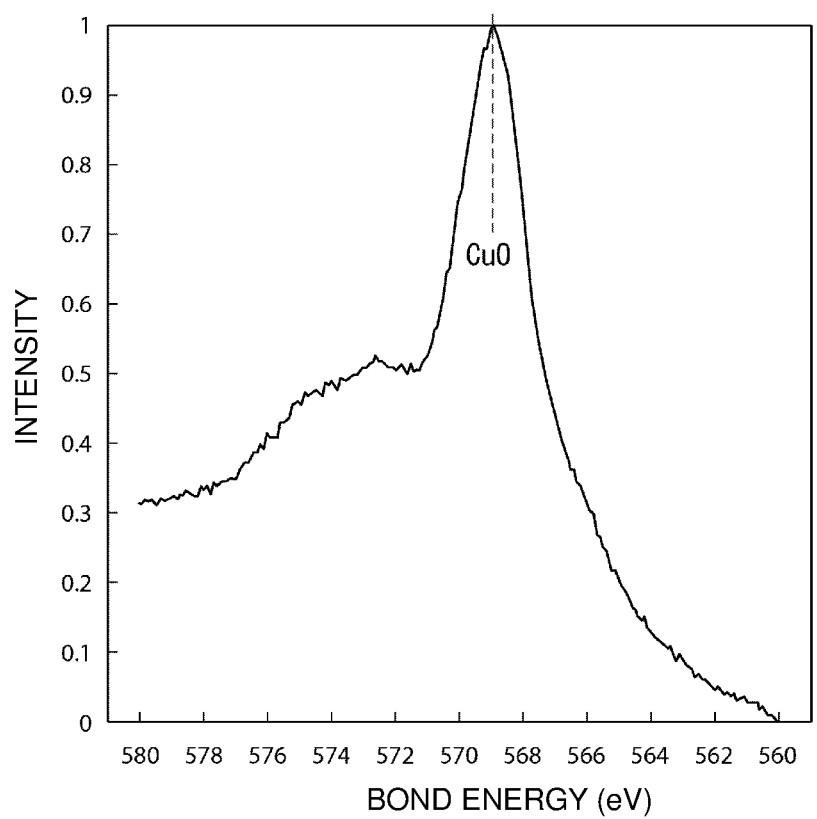
FIG. 13 is a Cu-LMM spectrum obtained in Experiment 3.

FIG. 13 is a Cu-LMM spectrum obtained in Experiment 3. As can be seen from FIG. 13, the Cu-LMM spectrum from Experiment 3 did not include a peak corresponding to Cu and did show a peak corresponding to CuO, indicating that Cu was not present on the surface of the protective layers while CuO did was present on the surface of the protective layers.

Insulation resistance IR ($\Omega$) was measured in the samples prepared in Experiments 1 to 3. A voltage of 6.3 V was applied between the external electrodes of each sample for 2 minutes with a drop of purified water on the portion where the external electrodes faced each other. The sample was considered to have short-circuited when the logarithm of the insulation resistance IR fell below 5 (log IR<5). The samples were then observed under a metallographic microscope for signs of electrochemical migration.

The sample prepared in Experiment 1, which had no protective layers, had a short circuit (log IR=3.3) and found to have experienced an electrochemical migration that connected the first and second external electrodes. With regard to the sample prepared in Experiment 3, which had protective layers composed solely of CuO, the insulation resistance of this ceramic multilayer capacitor remained unchanged from baseline (log IR=6.2), and no signs of electrochemical migration were observed. With regard to the sample prepared in Experiment 2, which had protective layers composed solely of $Cu_2O$, the insulation resistance of this ceramic multilayer capacitor slightly decreased (log IR=5.5), and there were no signs indicating a connection between the first and second external electrodes due to electrochemical migration.

As demonstrated by these results, the protective layers of $Cu_2O$ or CuO effectively prevented the external electrodes from electrochemical migration of Cu. In particular, the protective layers of CuO provided on the external electrodes were highly effective in preventing the ceramic electronic component from losing its insulation resistance.

Figure 9:
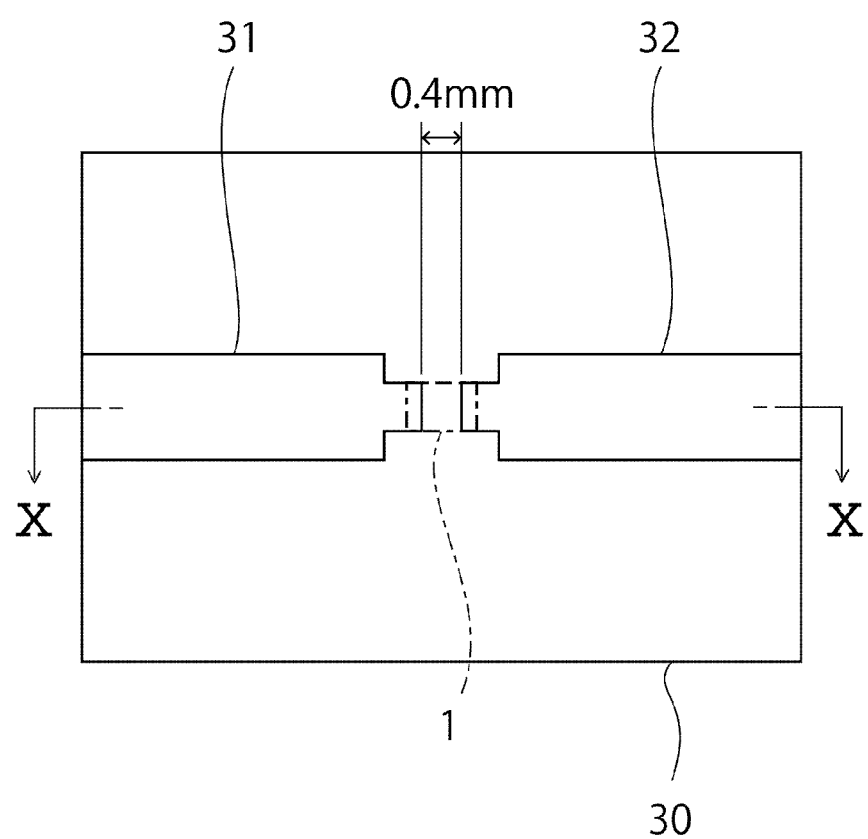
FIG. 9 is a schematic plan view of one of the electronic-component-embedded substrates fabricated in the Example.
Figure 10:
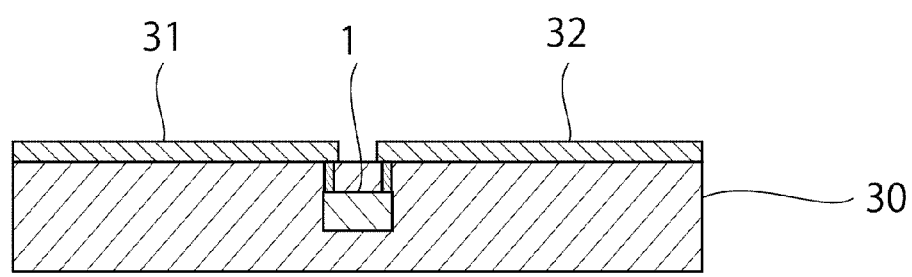
FIG. 10 is a schematic cross-sectional view taken along line X-X in FIG. 9.

In an Example, eighteen (18) electronic-component-embedded substrates were fabricated, each of which was formed of an epoxy resin substrate 30 (approximately 12 mm×12 mm×0.8 mm thick) and a ceramic electronic component 1 embedded substantially in the middle of its thickness as illustrated in FIGS. 9 and 10. Each ceramic electronic component 1 prepared measured approximately 1.0 mm, 0.5 mm, and 0.2 mm in length, width, and thickness, respectively, and the distance between its first and second external electrodes was about 0.44 mm, for example. The protective layers 15 and 16 of each embedded ceramic electronic component 1 contained CuO.

In a Comparative Example, eighteen (18) electronic-component-embedded substrates were fabricated in the same way as in the Example except that no protective layers were formed.

The samples prepared in the Example and the Comparative Example were left in an air atmosphere at a temperature of 120° C. and a humidity of 100% RH for 400 hours with a voltage of 6.3 V applied via electrodes 31 and 32. The samples were deemed to be defective if the insulation resistance IR of the embedded ceramic electronic component fell below 5 (log IR<5), and defective samples were counted. Table 1 summarizes the results. As shown in Table 1, the ceramic electronic components used in the Example, which had protective layers, were all non-defective, whereas all of the 18 ceramic electronic components used in the Comparative Examples, which had no protective layers, were defective.

TABLE 1

|  | Defective samples/All samples |
|---|---|
| Example | 0/18 |
| Comparative Example | 18/18 |

As demonstrated by these results, the protective copper oxide layers effectively prevented the external electrodes from ion migration and the electronic component from a decrease in insulation resistance associated with it.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for producing an electronic component, comprising:
preparing a body; and
forming an external electrode that is directly electrically connected with an outside element on the body; wherein
the external electrode is formed by:
    forming a copper-metal-containing layer containing copper metal; and
    oxidizing a surface of the copper-metal-containing layer to form a protective copper oxide layer;
the formed protective copper oxide layer covers an outer surface of the copper-metal-containing layer; and
the outside element is located outside of the electronic component that includes the body and the external electrode including the copper-metal-containing layer and the protective copper oxide layer.

2. The method for producing an electronic component according to claim 1, wherein the surface of the copper-metal-containing layer is oxidized by heating the external electrode in an oxygen-containing atmosphere.

3. The method for producing an electronic component according to claim 1, wherein the external electrode includes a curved portion extending on an external surface of the body and an apex of the curved portion is located in or substantially in a middle of the external surface of the body in a width direction.

4. The method for producing an electronic component according to claim 1, wherein the external electrode extends on an end surface and a main surface of an external surface of the body while all or substantially all of first and second lateral surfaces of the external surface of the body is exposed.

5. The method for producing an electronic component according to claim 1, wherein the outside element is a via-hole electrode.

* * * * *